United States Patent [19]

Okuhara et al.

[11] 4,084,110
[45] Apr. 11, 1978

[54] SEMICONDUCTOR SWITCH

[75] Inventors: Shinzi Okuhara, Fujisawa; Ichiro Ohhinata, Yokohama; Tatsuya Kamei; Masayoshi Suzuki, both of Hitachi, all of Japan

[73] Assignee: Hitachi, Ltd., Japan

[21] Appl. No.: 727,453

[22] Filed: Sep. 28, 1976

[30] Foreign Application Priority Data

Oct. 1, 1975 Japan .................. 50-117723
Oct. 1, 1975 Japan .................. 50-117724

[51] Int. Cl.² ........................ H03K 17/72
[52] U.S. Cl. ................. 307/252 G; 307/252 J; 307/305; 361/56
[58] Field of Search .......... 307/252 R, 252 D, 252 G, 307/252 H, 252 N, 252 J, 202, 305; 361/56

[56] References Cited

U.S. PATENT DOCUMENTS

| 3,434,022 | 3/1969 | Byrd | 307/252 G |
| 3,488,522 | 1/1970 | Cameron et al. | 307/252 G |

Primary Examiner—John Zazworsky
Attorney, Agent, or Firm—Craig & Antonelli

[57] ABSTRACT

A stable semiconductor switch comprising a PNPN switch, a transistor, a driving device, and diodes. The PNPN switch is composed of four-layered PNPN structure and has three PN-junctions, an anode, an anode gate, a cathode gate, and a cathode. The collector and the emitter of the transistor are connected to the cathode gate and the cathode of the PNPN switch, respectively. The driving device has its one end connected to the anode gate of the PNPN switch and its other end connected to the base of the transistor so as to drive the transistor in transient state. The diodes are connected between the driving device and the emitter of the transistor in a manner so that, when the PNPN switch is controlled to fire and a back current tends to flow through the PNPN switch temporarily, the back current does not flow through the transistor so as to prevent the transistor from causing any abnormal actions such as oscillation.

11 Claims, 13 Drawing Figures

SEMICONDUCTOR SWITCH

The present invention relates to a semiconductor switch of a PNPN four-layered equivalent structure with three PN-junctions used as a switching element for a control apparatus and the like.

Figure 2:
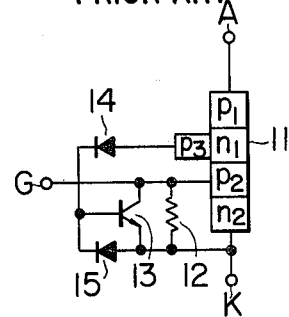
FIG. 2 is a circuit diagram of a semiconductor switch which has already been proposed by the present inventors and is most analogous to that according to the present invention.
Figure 3:
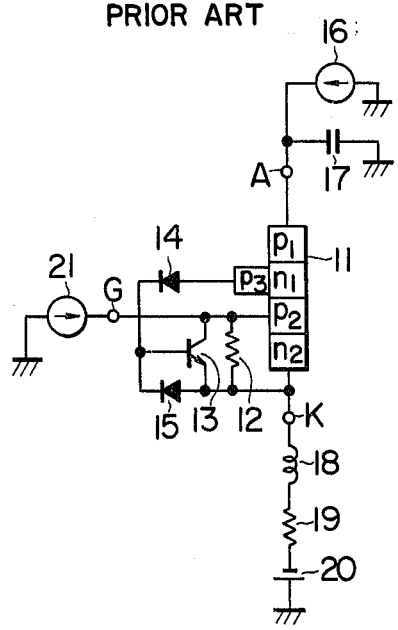
Figure 4:
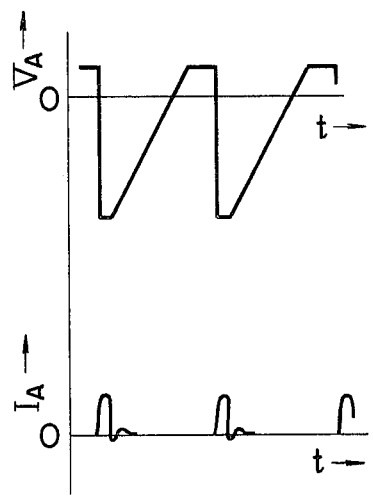

FIGS. 3 and 4 respectively show an equivalent circuit diagram representing the case where the semiconductor switch shown in FIG. 2 is applied for a telephone exchange, and waveforms representing voltage and current variations with time.

Figure 5:
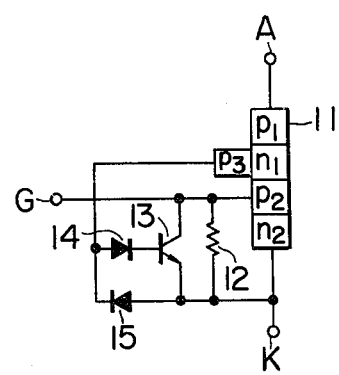

FIG. 5 is a circuit diagram showing a first embodiment of the semiconductor switch according to the present invention.

FIGS. 6 to 13 are circuit diagrams respectively showing second to ninth embodiments of the semiconductor switch according to the present invention.

Figure 1:
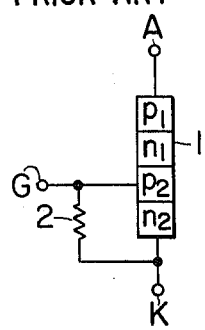
FIG. 1 is a circuit diagram of a semiconductor switch including a PNPN switch which is provided with well-known countermeasures against $dv/dt$ effect.

Generally, a PNPN switch of a PNPH four-layered equivalent structure including three PN junctions (hereinafter referred to merely as the "PNPN switch") called an SCR or thyristor has a disadvantage that it is erroneously fired in response to a forward voltage abruptly applied between the anode and cathode thereof even during the cut-off state. This is called a rate effect and a countermeasure against it is referred to as $dv/dt$-immunity. A method generally employed to prevent this erroneous firing is to shunt the gate G and the cathode K of the PNPN switch 1 by means of a resistor 2 as shown in FIG. 1. In case of improving the $dv/dt$-immunity by the method shown in FIG. 1, it will be necessary to set the resistor 2 at a low resistance value. This naturally reduces the gate sensitivity, thus making the method of FIG. 1 quite useless for some applications. In order to obviate this shortcoming, the applicants earlier suggested a semiconductor switch of FIG. 2 in which both the $dv/dt$-immunity and the gate-sensitivity are remarkably improved. In the semiconductor switch of FIG. 2, another P-type region $P_3$ is formed in the second layer $n_1$ of the PNPN switch 11, thus forming a couple of collectors $P_2$ and $P_3$. The base of transistor 13 between the gate G and the cathode K is connected to the $P_3$ region through a level shift diode 14. A resistor 12 is inserted between the gate G and the cathode K, while a diode 15 is connected between the base and emitter of the transistor 13. When a voltage is abruptly applied between the anode A and the cathode K of the PNPN switch 11, the current for charging the PN-junction formed by the $n_1$ layer and the $P_3$ region is utilized to drive the transistor 13, so that the gate G and the cathode K of the PNPN switch 11 are short-circuited in the transient state so as to prevent the erroneous firing of the PNPN switch 11. The resistor 12, which is inserted as an auxiliary element for prevention of erroneous firing of the PNPN switch, which otherwise might occur due to the leakage current at a high temperature, may have a resistance value much higher than the resistor 2 in FIG. 1, thus making possible the high $dv/dt$-immunity as well as the high gate-sensitivity of the PNPN switch. The level shift diode 14 is provided for preventing an abnormal increase in the holding current which otherwise might be caused by the energization of the transistor 13 since the $P_3$ region acts as the collector of the PNP transistor comprising the $P_1$, $n_1$ and $P_3$ regions when the PNPN switch 11 is driven to fire. The diode 15 is inserted for the purpose of preventing the base of the transistor 13 from being subjected to a large negative potential in response to the discharge of charges stored in the PN-junction made up of the $n_1$ layer and the $P_3$ region. This construction has an effect similar to that obtained by shunting the base and the emitter of the transistor 13 with a resistor and is suitable for the circuit integration. The semiconductor switch shown in FIG. 2 has a shortcoming that it may cause oscillation in special applications such as a telephone exchange.

In FIG. 3 is shown a typical exchange process in the telephone exchange system to which the semiconductor switch of FIG. 2 is applied. The anode A of the PNPN switch 11 is connected with a constant-current circuit 16 and a capacitor 17, while the cathode K thereof is connected with a series circuit of a coil 18, a resistor 19 and a battery 20. When the gate G is driven continuously by another constant-current circuit 21, an oscillation as shown in FIG. 4 occurs, resulting in an intermittent conduction of the PNPN switch.

In FIG. 4, the upper waveform represents variations in the anode potential VA of the PNPN switch 11 with time, and the lower waveform variations in the anode current IA with time. The transistor 13 is temporarily driven by the oscillation current due to the capacitor 17 and the coil 18, so that the PNPN switch 11 is cut off as the gate and the cathode thereof is short-circuited. In the subsequent stage where the capacitor 17 is charged by the constant-current circuit 16 and rises in potential, the $dv/dt$ protective function surpases the gate current, and therefore the PNPN switch cannot be driven to fire until the voltage becomes constant after completion of charging operation. In other words, when the PNPN switch 11 is driven to fire, the charges in the capacitor 17 are released through the coil 18 and the resistor 19, while the current oscillates due to the coil 18 and the capacitor 17 and temporarily flows backward through the PNPN switch 11. This back current flows from the cathode K to the $P_1$ layer through the diode 15, the base of transistor 13, the collector of the transistor 13, the $P_2$ layer, and $n_1$ layer during the storage time when the PNPN switch 11 is not cut off as yet. In the process, the transistor 13 acts as an inverse NPN transistor which has the collector and the emitter thereof interchanged with each other. In the subsequent stage where the current begins to flow in forward direction, the transistor 13 continues to operate temporarily due to the storage effect. As a result, the gate G and the cathode K of the PNPN switch 11 are short-circuited by the transistor 13, so that the PNPN switch 11 is cut off. Since the potential of the anode A rises steadily, the transistor 13 is driven by the charge current of the $n_1P_3$ junction. Accordingly, the circuit of FIG. 3 has a shortcoming that it continues oscillation and therefore cannot stabilize the PNPN switch 11 in the turned-on state.

An object of the present invention is to provide a semiconductor switch of PNPN four-layered structure with high gate-sensitivity and high $dv/dt$-immunity, which can be stably controlled without oscillation even when it is used in a circuit including a capacitor and a coil.

Another object of the invention is to provide a semiconductor switch of PNPN four-layered structure which can be easily formed into semiconductor integrated circuits.

According to the present invention, there is provided a semiconductor switch comprising a PNPN switch of PNPN four-layered structure with at leeast three PN-junctions, a transistor, a driving device coupled to the PNPN switch for driving the transistor in the transient state, an element with at least a PN-junction, and a diode. The collector and the emitter of the transistor are so connected as to short-circuit one of the PN-junctions at one end of the PNPN switch. The base of the transistor is connected to the driving device through the element with the PN-junction. The diode is inserted between the emitter of the transistor and the driving device. The above and other objects, features and advantages of the invention will be made apparent by the detailed description of the following preferred embodiments taken in conjunction with the accompanying drawings.

A circuit diagram of a first embodiment of the semiconductor switch according to the present invention is shown in FIG. 5. Another P-type region $P_3$ is formed on the second layer $n_1$ of the PNPN switch 11, so that a couple of collectors are formed by the P-type regions $P_2$ and $P_3$. The collector and the emitter of a transistor 13 are connected to the gate and the cathode of the PNPN switch 11 respectively, while the base of the transistor 13 is connected in series with a level shift diode 14. Through this diode 14, the base of the transistor 13 is further connected to the $P_3$ region formed on the second layer $n_1$ of the PNPN switch 11, which makes up the driving device for driving the transistor 13 in the transient state. A discharging diode 15 is inserted between the emitter of the transistor 13 and the driving device. The gate and the cathode of the PNPN switch are connected by the resistor 12. By the way, like component elements are denoted by like reference numerals in FIG. 2 as in the drawing under consideration. In the semiconductor switch of FIG. 5 with this construction, assume that an instantaneous back current tends to flow in the PNPN switch 11 as shown in FIG. 3, namely, that even when the potential of the cathode K of the PNPN switch instantaneously becomes higher than that of the anode A in the conducting state, the back current flows from the diode 15 to the anode A through the $P_3$ region, $n_1$ layer, and $P_1$ layer when the PNPN switch 11 is still within a storage time and maintained in semi-energized state. Since the voltage drop is increased by that equivalent to two diodes more than in the previously-shown path, substantially no current flows through the level shift diode 14 and the base-collector side of the transistor 13. If the semiconductor switch as shown in FIG. 5 is used in the circuit of FIG. 3, the PNPN switch can be transferred into the stable conduction state without any oscillation even though a small oscillatory current is observed at the instant when the PNPN switch 11 is driven to fire.

Figure 6:
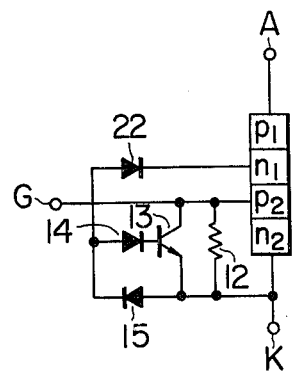

The circuit configuration of a second embodiment of the semiconductor switch according to the present invention is shown in FIG. 6. In the semiconductor switch of FIG. 5, the $n_1$ layer of the PNPN switch 11 and the capacitance of the $n_1P_3$ junction between the $n_1$ layer and the $P_3$ region are used as the driving device for turning on the transistor 13 only in the transient state to prevent the rate effect of the PNPN switch 11. In the semiconductor switch shown in FIG. 6, on the other hand, the voltage applied between the anode A and cathode K is differentiated by a diode 22 having comparatively large junction capacitance so as to drive the transistor 13. The circuit configuration of FIG. 6 is substantially the same as that of FIG. 5 except that the diode 22 partially acts as a capacitor. In other words, the level shift diode 14 is connected to the base of the transistor 13, while the discharging diode 15 is connected directly to the diode 22 providing the driving device. The function and the effect of this configuration are the same as those of the circuit of FIG. 5.

Figure 7:
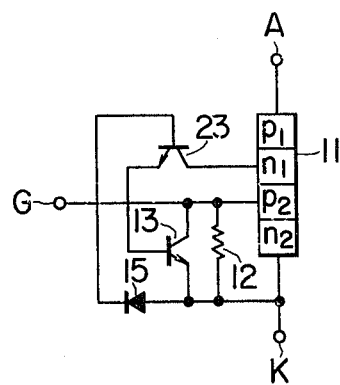

The circuit configuration of a third embodiment of the semiconductor switch according to the present invention is shown in FIG. 7. In the semiconductor switch shown in FIG. 7, the collector of a transistor 23 is connected to the $n_1$ layer of the PNPN switch 11, and the emitter thereof to the base of the transistor 13, with a discharging diode 15 connected to the base of the transistor 23. According to the circuit configuration shown in FIG. 7, the voltage applied between anode A and cathode K is fed to the collector-base junction of the transistor 23, so that the charge current of this junction is amplified by the transistor 23 itself so as to drive the transistor 13 in the transient state, thus preventing the rate effect of the PNPN switch 11. It will be understood that this construction is similar to that of the circuit of FIG. 6 with the diode 22 integrated with the diode 14 except for the amplifying function of the transistor 23. In other words, the base-emitter junction of the transistor 23 performs the same function as the level shift diode 14 shown in FIG. 6. By the use of the transistor 23, the transient current is amplified and therefore higher $dv/dt$-immunity is obtained. At the same time, against the back current due to the oscillatory current, the transistor 23 functions as a inverse transistor with the emitter and collector thereof operatively interchanged with each other, thus reducing the base voltage of the transistor 13. In other words, the transistor 13 is biased into the turned-off state.

Figure 8:
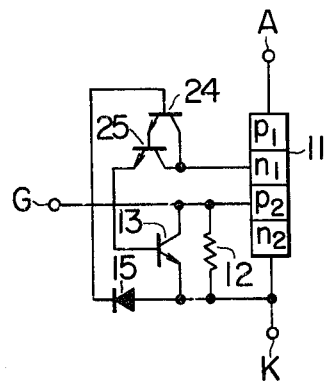

The circuit configuration of a fourth embodiment of the semiconductor switch according to the present invention is shown in FIG. 8. This semiconductor switch is such that the driving device for the transistor 13 are configured as a Darlington circuit including transistors 24 and 25. Since the current for charging the base-collector capacitance of the transistor 24 is amplified to a larger extent, this circuit offers a configuration advantageous in obtaining higher $dv/dt$-immunity or the same $dv/dt$-immunity in spite of a miniature transistor. In the circuit configuration of FIG. 8, the level shift diode 14 of FIG. 6 is considered to be equivalent to the series-connected base-emitter junctions of the transistors 24 and 25, thus offering a sufficient counteraction against a back current.

Figure 9:
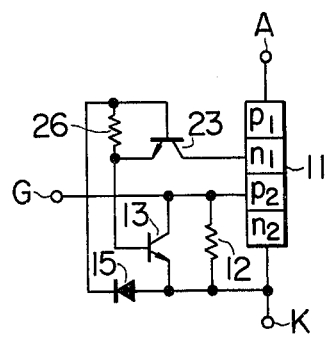

The diagram of FIG. 9 shows the circuit configuration of a fifth embodiment of the semiconductor switch according to the present invention. This circuit is equivalent to the circuit of FIG. 7 with a resistor 26 inserted between the emitter and the base of the transistor 23 making up the driving device for the transistor 13, the other configuration being identical to that of FIG. 7. In the semiconductor switch thus constructed, the breakdown voltage between the emitter and collector of the transistor 23 making up the driving device for the transistor 13 is much more improved as compared with the circuit shown in FIG. 7, so that a semiconductor switch more advantageous to a high voltage circuit can be provided.

Figure 10:
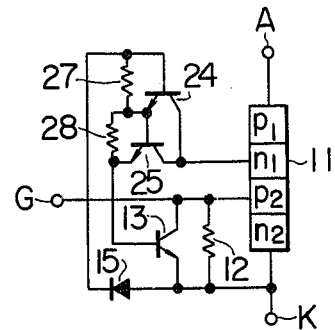

A sixth embodiment of the semiconductor switch according to the present invention is shown in the circuit configuration of FIG. 10. Like the circuit shown in FIG. 9, the semiconductor switch under consideration is identical to the circuit of FIG. 8 except with resistors 27 and 28 inserted between the emitter and base of the transistors 24 and 25 in Darlington configuration respectively making up the driving device for the transistor 13. Therefore, the effect and functions of this embodiment will not be described.

Figure 11:
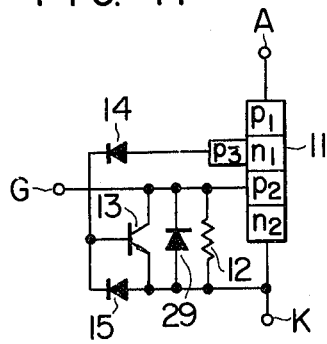

The circuit diagram of a seventh embodiment of the semiconductor switch according to the present invention is shown in FIG. 11. Another P-type region $P_3$ is formed on the second layer $n_1$ of the PNPN switch 11, so that the P-type regions $P_2$ and $P_3$ make up a couple of collectors. A transistor 13 has the collector and the emitter thereof connected to the gate and the cathode of the PNPN switch 11, respectively. The base of the transistor 13 is connected to the $P_3$ region through the level shift diode 14. A resistor 12 is inserted between the gate G and the cathode K. A diode 29 is inserted between the emitter of the transistor 13 and the gate G of the PNPN switch 11 in such a manner as to pass the back current of the PNPN switch 11. A diode 15 is connected between the base and the emitter of the transistor 13. Component elements similar to those included in the circuit of FIG. 2 are denoted by like reference numerals.

In the semiconductor switch with this construction, the diode 29 fails to operate in response to the forward current of the PNPN switch 11 from the anode A to the cathode K, thus displaying the high gate-sensitivity as well as the high $dv/dt$-immunity. When this semiconductor switch is used in the circuit shown in FIG. 3, the oscillatory current flowing backward through the PNPN switch 11 is bypassed through the diode 29, so that the oscillated condition which otherwise might be caused by the back current flowing through the transistor 13 is prevented completely. In other words, when a back current flows temporarily through the PNPN switch 11 which has already been fired, the transistor section composed of the $P_1$, $n_1$ and $P_2$ layers of the PNPN switch 11 with a comparatively long storage time is kept in conduction, with the result that a current flows from the cathode K to the anode A through the diode 29, the $P_2$ layer, the $n_1$ layer, and the $P_1$ layer. In that process, substantially no current flows in the diode 15 since the voltage drop of the path including the diode 15, the base of the transistor 13, and the collector thereof is approximately twice as much as that of the path including the diode 29. That does not result in any oscillation as explained with reference to FIG. 3, thus making possible a stable switching operation.

Figure 12:
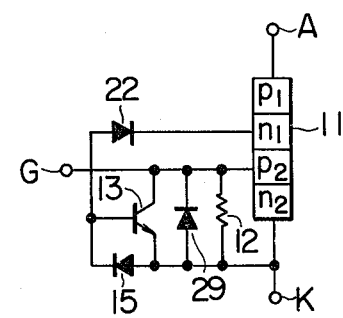

The circuit configuration of an eighth embodiment of the semiconductor switch according to the present invention is shown in FIG. 12. In the semiconductor switch shown in FIG. 11, the capacitance of the $n_1P_3$ junction formed by the $n_1$ layer, namely, between the second layer $n_1$ and the $P_3$ layer of the PNPN switch 11 is used. In the semiconductor switch shown in FIG. 12, like in the circuit of FIG. 6, the voltage applied between the anode A and the cathode K is differentiated by the diode 22 with a comparatively large junction capacitance thereby to drive the transistor 13. The circuit shown in FIG. 12, like the circuit of FIG. 6, utilizes the diode 22 partially as a capacitor. The other construction, the functions, and the effects thereof are identical to those of the circuit shown in FIG. 11.

Figure 13:
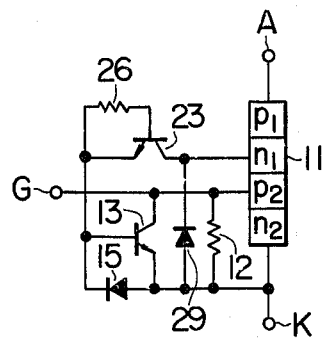

A ninth embodiment of the semiconductor switch according to the present invention is shown in the circuit configuration of FIG. 13. In the semiconductor switch of FIG. 13, a transistor 23 has the collector thereof connected to the second layer $n_1$ of the PNPN switch 11 and the emitter thereof connected to the base of the transistor 13. A resistor 26 is inserted between the base and the emitter of the transistor 23. Further, the diode 29 is inserted between the emitter of the transistor 13 and the second layer $n_1$ of the PNPN switch 11. According to the circuit configuration shown in FIG. 13, the voltage applied between the anode A and the cathode K is applied to the collector-base junction of the transistor 23, while the charge current in that junction is amplified by the transistor 23 itself thereby to drive the transistor 13 in a transient way, thus preventing the rate effect of the PNPN switch 11. The resistor 26, like the resistors 26, 27 and 28 shown in FIGS. 9 and 10, is for improving the breakdown voltage between the emitter and the collector of the transistor 23.

It will thus be seen that according to the present invention, a semiconductor switch is realized, which, in spite of its high gate-sensitivity and high $dv/dt$-immunity, performs a stable switching operation without causing any abnormal actions such as oscillation.

Although the foregoing descriptions of the embodiments relate to the short-circuiting of the $P_2n_2$ junction counted as the third junction from the anode of the PNPN switch by means of a transistor for preventing the rate effect, the $P_1n_1$ junction counted as the first junction from the anode A may alternatively be short-circuited by the PNP transistor or otherwise a circuit quite complementary with the above-mentioned construction may be employed with equal effect. Furthermore, a couple of semiconductor switches according to the present invention may be connected in inverseparallel to form a bidirectional switch with equal effect.

What is claimed is:

1. A semiconductor switch comprising: a PNPN switch of a PNPN four-layered equivalent structure including at least three PN-junctions; a transistor connected so as to short-circuit in transient state one of the PN-junctions at one end of said PNPN switch; drive means coupled to said PNPN switch for driving said transistor in transient state; and a diode connected between the emitter and the base of said transistor, wherein said semiconductor switch further comprises a bypass circuit for preventing a back current between an anode and a cathode of said PNPN switch from passing through the base and the collector of said transistor, said bypass circuit being provided between the emitter of said transistor and selected one of the anode gate and a cathode gate of said PNPN switch.

2. A semiconductor switch comprising a PNPN switch of a PNPN four-layered equivalent structure including three PN-junctions, a transistor, drive means coupled to said PNPN switch for driving said transistor in transient state, an element having at least a PN-junction, and a diode, wherein the collector and the emitter of said transistor are connected so as to short-circuit in transient state one of the PN-junctions at one end of said PNPN switch, the base of said transistor being connected to said drive means through said element having said PN-junction, said diode being inserted between the emitter of said transistor and said drive means.

3. A semiconductor switch comprising:
a PNPN switch of a PNPN four-layered equivalent structure having four PN-junctions, an anode gate, a cathode gate and a cathode;
a transistor;

a couple of diodes; and
a resistor;
said PNPN switch including an additional P-type collector region on a region of said anode gate thereof, said resistor being inserted between the collector and the emitter of said transistor, said collector and said emitter of said transistor being connected to the cathode gate and the cathode of said PNPN switch, respectively, the base of said transistor being connected through one of said diodes to said P-type collector region formed on said anode gate region of said PNPN switch, the other diode being inserted between said emitter of said transistor and said P-type collector region formed on said anode gate region of said PNPN switch.

4. A semiconductor switch comprising: a PNPN switch of a PNPN four-layered equivalent structure having three PN-junctions, an anode gate, a cathode gate, and a cathode; a transistor; three diodes; and a resistor, wherein said resistor is inserted between the collector and the emitter of said transistor, said collector and said emitter of said transistor being connected to the cathode gate and the cathode of said PNPN switch, respectively, a first one of said diodes having one end thereof connected to the anode gate of said PNPN switch in a direction opposite to the anode gate current, a second one of said diodes being connected between the other end of said diode and the base of said transistor in the same direction as the current flowing into said base, a third one of said diodes being inserted between the other end of said first diode and the cathode of said PNPN switch.

5. A semiconductor switch comprising: a PNPN switch of a PNPN four-layered equivalent structure having three PN-junctions, an anode gate, a cathode gate, and a cathode; a first transistor; a second transistor; a resistor; and a diode, wherein said resistor is inserted between the collector and the emitter of said first transistor, said collector and said emitter of said first transistor being connected to the cathode gate and the cathode of said PNPN switch, respectively, the collector of said second transistor being connected to the anode gate of said PNPN switch, the emitter of said second transistor being connected to the base of said first transistor, the base of said second transistor being connected to the cathode of said PNPN switch through said diode.

6. A semiconductor switch comprising: a PNPN switch of a PNPN four-layered equivalent structure having three PN-junctions, an anode gate, a cathode gate, and a cathode; a first transistor; a second transistor; a third transistor; a resistor; and a diode, wherein said resistor is inserted between the collector and the emitter of said first transistor, said collector and said emitter of said transistor being connected to the cathode gate and the cathode of said PNPN switch, respectively, said second and said third transistors being connected in Darlington configuration, the collectors of said second and said third transistors in Darlington configuration being connected in common to the anode gate of said PNPN switch, the emitter of said third transistor in Darlington configuration being connected to the base of said first transistor, the base of said second transistor being connected through said diode to the cathode of said PNPN switch.

7. A semiconductor switch comprising: a PNPN switch of a PNPN four-layered equivalent structure having three PN-junctions, an anode gate, a cathode gate, and a cathode; a first transistor; a second transistor; a couple of resistors; and a diode, wherein one of said resistors is inserted between the collector and the emitter of said first transistor, the collector and the emitter of said first transistor being connected to the cathode gate and the cathode of said PNPN switch, respectively, the collector of said second transistor being connected to the anode gate of said PNPN switch, the emitter of said second transistor being connected to the base of said first transistor, the base of said second transistor being connected to the cathode of said PNPN switch through said diode, the other resistor being connected between the base and the emitter of said second transistor.

8. A semiconductor switch comprising: a PNPN switch of a PNPN four-layered equivalent structure having three PN-junctions, an anode gate, a cathode gate and a cathode; a first transistor; a second transistor; a third transistor; three resistors; and a diode, wherein a first one of said resistors is inserted between the collector and the emitter of said first transistor, said collector and said emitter of said first transistor being connected to the cathode gate and the cathode of said PNPN switch, respectively, said second transistor and said third transistor being connected in Darlington configuration, the collectors of said second and said third transistors being connected in common to the anode gate of said PNPN switch, the emitter of said third transistor in said Darlington configuration being connected to the base of said first transistor, the base of said second transistor being connected through said diode to the cathode of said PNPN switch, a second one of said resistors and a third one of said resistors being inserted between the base and the emitter of said second transistor and between the base and the emitter of said third transistor, respectively.

9. A semiconductor switch comprising: a PNPN switch of a PNPN four-layered equivalent structure having four PN-junctions, an anode gate, a cathode gate, and a cathode; a transistor; three diodes; and a resistor, said PNPN switch further including an additional P-type collector region on a region of said anode gate thereof, wherein said resistor is inserted between the collector and the emitter of said transistor, said collector and said emitter of said transistor being connected to the cathode gate and the cathode of said PNPN switch, respectively, a first one of said diodes being connected between the emitter and the base of said transistor, said base of said transistor being connected through a second one of said diodes to said P-type collector region added to said anode gate region of said PNPN switch, a third one of said diodes being inserted between said emitter of said transistor and selected one of said anode gate and said cathode gate of said PNPN switch in the direction opposite to the forward current of said PNPN switch.

10. A semiconductor switch comprising: a PNPN switch of a PNPN four-layered equivalent structure having three PN-junctions, an anode gate, a cathode gate, and a cathode; a transistor; three diodes; and a resistor, wherein said resistor is inserted between the collector and the emitter of said transistor, said collector and said emitter of said transistor being connected to the cathode gate and the cathode of said PNPN switch, respectively, the base of said transistor being connected to the anode gate of said PNPN switch through a first one of said diodes, a second one of said diodes being inserted between said base and said emitter of said transistor, a third one of said diodes being connected between said emitter of said transistor and selected one of said anode gate and said cathode gate of said PNPN switch in the direction opposite to the forward current of said PNPN switch.

11. A semiconductor switch comprising: a PNPN switch of a PNPN four-layered equivalent structure having three PN-junctions, an anode gate, a cathode gate, and a cathode; a first transistor; a second transistor; a couple of diodes; and a couple of resistors, wherein a first one of said resistors being inserted between the collector and the emitter of said first transistor, said collector and said emitter of said first transistor being connected to the cathode gate and the cathode of said PNPN switch, respectively, a first one of said diodes being connected between the base and said emitter of said first transistor, the collector of said second transistor being connected to the anode gate of said PNPN switch, the emitter of said second transistor being connected to said base of said first transistor, a second one of said resistors being inserted between the base and the emitter of said second transistor, a second one of said diodes being connected between the emitter of said first transistor and selected one of said anode gate and said cathode gate of said PNPN switch in the direction opposite to the forward current of said PNPN switch.

* * * * *